(12) United States Patent
Fang (10) Patent No.: US 11,665,986 B2
(45) Date of Patent: May 30, 2023

(54) MEMORY DEVICE

(71) Applicant: NANYA TECHNOLOGY CORPORATION, New Taipei (TW)

(72) Inventor: Wei-Chuan Fang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/644,791

(22) Filed: Dec. 17, 2021

(65) Prior Publication Data

US 2022/0115591 A1    Apr. 14, 2022

Related U.S. Application Data

(62) Division of application No. 16/388,858, filed on Apr. 18, 2019, now Pat. No. 11,239,415.

(51) Int. Cl.
| | | |
|---|---|---|
| *H01L 21/02* | (2006.01) | |
| *H01L 51/00* | (2006.01) | |
| *H01L 45/00* | (2006.01) | |

(52) U.S. Cl.
CPC ..... *H10N 70/841* (2023.02); *H01L 21/02606* (2013.01); *H10K 30/821* (2023.02); *H10K 71/10* (2023.02); *H10K 85/20* (2023.02); *H10K 85/221* (2023.02); *H10N 70/011* (2023.02)

(58) Field of Classification Search
CPC ... H01L 45/1253; H01L 45/16; H01L 45/146; H01L 51/0002; H01L 51/0045; H01L 51/0048; H01L 51/444; H01L 21/02606
See application file for complete search history.

(56) References Cited

U.S. PATENT DOCUMENTS

| | | | |
|---|---|---|---|
| 10,566,536 B2* | 2/2020 | Carroll | H10K 85/111 |
| 2009/0272565 A1* | 11/2009 | Gosset | H01L 21/76831 |
| | | | 977/762 |
| 2011/0042231 A1* | 2/2011 | Wolf | B82Y 30/00 |
| | | | 205/618 |
| 2013/0288434 A1 | 10/2013 | Chang et al. | |
| 2015/0348911 A1 | 12/2015 | Xiao | |
| 2017/0244055 A1* | 8/2017 | Bangsaruntip | H01L 21/28114 |
| 2018/0151470 A1* | 5/2018 | Cook | H01L 23/3731 |
| 2019/0363252 A1* | 11/2019 | Appenzeller | H01L 45/146 |

OTHER PUBLICATIONS

Xu, Haifeng; Nitrogen-doped graphene: Synthesis, characterizations and energy applications; Date available online Dec. 9, 2017; Journal of Energy Chemistry 27 (2018) 146-160 (Year: 2017).*

Zhenni Wan et al.,"Engineering of the resistive switching properties in V2O5 thin film by atomic structural transition: Experiment and theory" Journal of Applied Physics 124, 105301(2018), published by the American Institute of Physics, Sep. 10, 2018 (View online:http://doi.org/10.1063/1.5045826).

(Continued)

*Primary Examiner* — Omar F Mojaddedi
(74) *Attorney, Agent, or Firm* — CKC & Partners Co., LLC (57) ABSTRACT

A memory device includes a bottom electrode, an insulating layer, and a top electrode. The bottom electrode includes a plurality of carbon nanotubes. The insulating layer is disposed over the plurality of carbon nanotubes. The top electrode includes a graphene layer separated from the plurality of carbon nanotubes by the insulating layer.

5 Claims, 12 Drawing Sheets

(56) References Cited

OTHER PUBLICATIONS

Cheng-Lin Tsai et al., "Resistive Random Access Memory Enable by Carbon Nanotube Crossbar Electrodes", American Chemical Society, vol. 7, No. 6, 5360-5366, May 25, 2013.

Yue Bai et al., "Stacked 3D RRAM Array with Graphene/CNT as Edge Electrodes" Scientific Reports, (5:13785, DOI:10.1038/srep13785) Sep. 8, 2015.

Ying-Chen Chen et al., "Graphite-based selectodess RRAM: improvable intrinsic nonlinearity for array applications", The Royal Society of Chemistry, Nanoscale, 2018, 10.15608-15614, (DOI:10.1039/c8nr04766a).

Haifeng Xu et al., "Nitrogen-doped graphene: Synthesis, characterizations and energy applications" Journal of Energy Chemistry 27, 2018, 146-160, Science Press and Dalian Institute of Chemical Physics, Chinese Academy of Sciences published by Elsevier B.V., Available Online: Dec. 9, 2017.

\* cited by examiner

MEMORY DEVICE

CROSS-REFERENCE TO RELATED APPLICATION

This application is a Divisional Application of the U.S. application Ser. No. 16/388,858, filed on Apr. 18, 2019, the entirety of which is incorporated by reference herein in their entireties.

BACKGROUND

Technical Field

The present disclosure relates to a memory device.

Description of Related Art

Resistive random access memory (RRAM) is used in variety of electronic applications because RRAM has advantage of high speed, low power consumption, and superior scalability. RRAM is a memory structure including an array of RRAM cells each of which stores a bit of data using resistance values. RRAM cell includes a resistive material layer, the resistance of which can be adjusted to represent logic "0" or logic "1." The basic RRAM is composed of an upper metal electrode, a lower metal electrode, and a transition metal oxide.

SUMMARY

According to an embodiment of the present disclosure, a memory device includes a bottom electrode, an insulating layer, and a top electrode. The bottom electrode includes a plurality of carbon nanotubes. The insulating layer is over the carbon nanotubes. The top electrode includes a graphene layer separated from the carbon nanotubes by the insulating layer.

In one or more embodiments of the present disclosure, the carbon nanotubes are nitrogen-doped.

In one or more embodiments of the present disclosure, the graphene layer is nitrogen-doped.

In summary, the disclosure provides a memory device including a bottom electrode and a top electrode. The bottom electrode includes a plurality of carbon nanotubes and the top electrode includes a graphene layer. Since carbon-containing materials have a better conductivity to transmit the electric charges, the electrodes made of the carbon-containing materials can improve the rate of signal transmission. As a result, a memory device with higher speed can be achieved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 to 6 are schematic views of a method of forming a memory device 10 at various stages in accordance with an embodiment of the present disclosure. The memory device 10 may be a resistive random access memory (RRAM) cell in the present disclosure. The RRAM cell may be used to hold a binary piece of data, or a bit, by changing the properties of an intermediate dielectric layer in memory elements so as to change the resistance of the dielectric layer. A bit may be encoded by setting the resistance of the dielectric layer to a relatively high resistance state or a relative low resistance state. A value of one is assigned to one state, while a value of zero is assigned to the other state. For example, the value of one is assigned to an on-state, while the value of zero is assigned to an off-state. In greater detail, the RRAM cell operates under the principle that a dielectric layer, e.g., generally insulating layer, can be made to conduct through a filament or conduction path formed after the application of a sufficiently high voltage. The forming of a filament or conduction path can be referred to as forming operation of the RRAM cell. The sufficiently high voltage can be referred to as a form voltage used in the forming operation of the RRAM cell. The form voltage is a different voltage from the voltage used to read and write the RRAM cell. In some embodiments, the form voltage is at a higher absolute value or has a different polarity. The filament or conduction path is broken by passing a voltage different from the form voltage during the write operation. In some embodiments, the write voltage has a different polarity than the form voltage. A subsequent write operation applies a different voltage which is less than the form voltage to reconnect the broken filament. By changing the filament, a high or low resistance is stored in the RRAM cell which does not change when the power is removed. Either the high resistance or the low resistance may be read as a value of zero or a value of one, respectively. A read voltage is applied across the RRAM cell during a read operation. In some embodiments, the read voltage is much smaller than the write voltage so as to avoid inadvertent writing of the RRAM cell to a different value.

Figure 1:
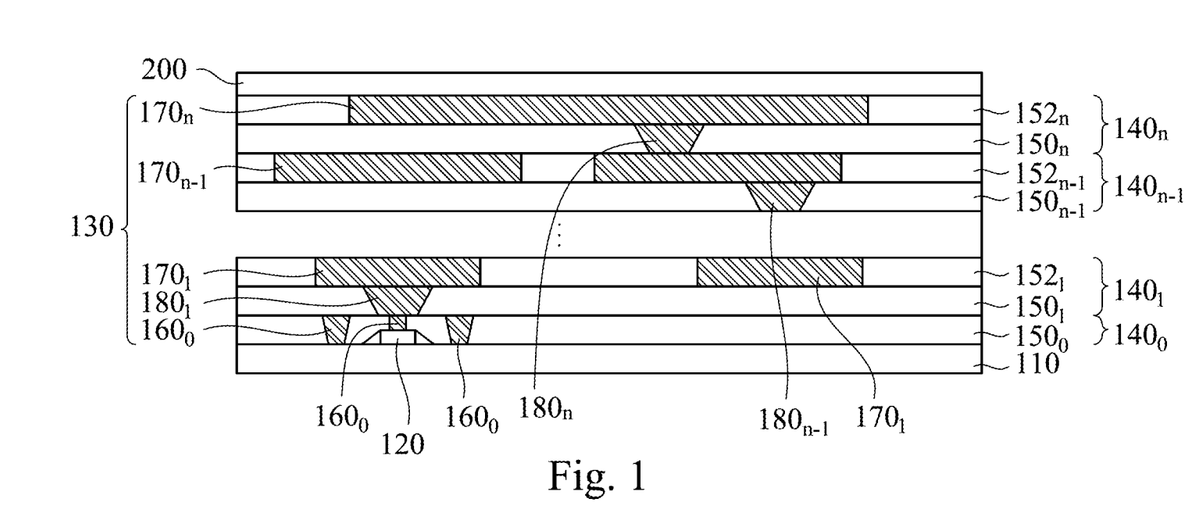
FIGS. 1 to 6 are schematic views of a method of forming a memory device at various stages in accordance with an embodiment of the present disclosure.

As shown in FIG. 1, a conductive layer 200 is formed over an interconnect structure 130 which is formed over a substrate 110. In some embodiments, the substrate 110 may be a silicon substrate. Alternatively, the substrate 110 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, one or more active and/or passive devices 120 are formed on the substrate 110. The one or more active and/or passive devices 120 may include various N-type metal-oxide semiconductor (NMOS) and/or P-type metal-oxide semiconductor (PMOS) devices, such as transistors.

In some embodiments, the interconnect structure 130 is formed over the one or more active and/or passive devices 120 and the substrate 110. The interconnect structure 130 electrically interconnects the one or more active and/or passive devices 120 to form functional electrical circuits. The interconnect structure 130 may include one or more metallization layers $140_0$ to $140_n$, wherein n+1 is the number of the one or more metallization layers $140_0$ to $140_n$. In some embodiments, the value of n may vary in response to design specifications of the memory device 10. The metallization layers $140_0$ to $140_n$ may include dielectric layers $150_0$ to $150_n$, respectively. The metallization layers $140_1$ to $140_n$ may include dielectric layers $152_1$ to $152_n$, respectively. The dielectric layers $152_1$ to $152_n$ are formed over the corresponding dielectric layers $150_1$ to $150_n$.

In some embodiments, the dielectric layer $150_0$ can be referred to as an inter-layer dielectric (ILD) layer, and the dielectric layers $150_1$ to $150_n$ and dielectric layers $152_1$ to $152_n$ can be referred to as inter-metal dielectric (IMD) layers.

In some embodiments, the metallization layer $140_0$ may include conductive plugs $160_0$ through the dielectric layer $150_0$, and the metallization layers $140_1$ to $140_n$ include one or more conductive interconnects, such as conductive lines $170_1$ to $170_n$ respectively in dielectric layers $152_1$ to $152_n$ and conductive vias $180_1$ to $180_n$ respectively in dielectric layers $150_1$ to $150_n$. The conductive plugs $160_0$ electrically couple the one or more active and/or passive devices 120 to the conductive lines $170_1$ to $170_n$ and the conductive vias $180_1$ to $180_n$.

In some embodiments, the conductive plugs $160_0$, the conductive lines $170_1$ to $170_n$ and the conductive vias $180_1$ to $180_n$ may be formed using any suitable methods, such as damascene, dual damascene, or the like. The conductive plugs $160_0$, the conductive lines $170_1$ to $170_n$ and the conductive vias $180_1$ to $180_n$ may comprise conductive materials such as copper, aluminum, tungsten, combinations thereof, or the like. In some embodiments, the conductive plugs $160_0$, the conductive lines $170_1$ to $170_n$, and the conductive vias $180_1$ to $180_n$ may further comprise one or more barrier/adhesion layers (not shown) to protect the respective dielectric layers $150_0$ to $150_n$ and $152_0$ to $152_n$ and from diffusion and metallic poisoning. The one or more barrier/adhesion layers may comprise titanium, titanium nitride, tantalum, tantalum nitride, or the like, and may be formed using physical vapor deposition (PVD), CVD, ALD, or the like.

The conductive layer 200 is blanket formed over the interconnect structure 130. In other words, the conductive layer 200 is formed over the dielectric layer $152_n$ and the conductive line $170_n$. Stated differently, the conductive layer 200 is in contact with a top surface of the conductive line $170_n$ as well as a top surface of the dielectric layer $152_n$. In some embodiments, the conductive layer 200 is a metal layer. For example, the conductive layer 200 is a Titanium (Ti) film with 100 nm thickness, but the disclosure is not limited thereto.

The conductive layer 200 may be formed over the substrate 110 by sputtering or other suitable methods.

Figure 2:
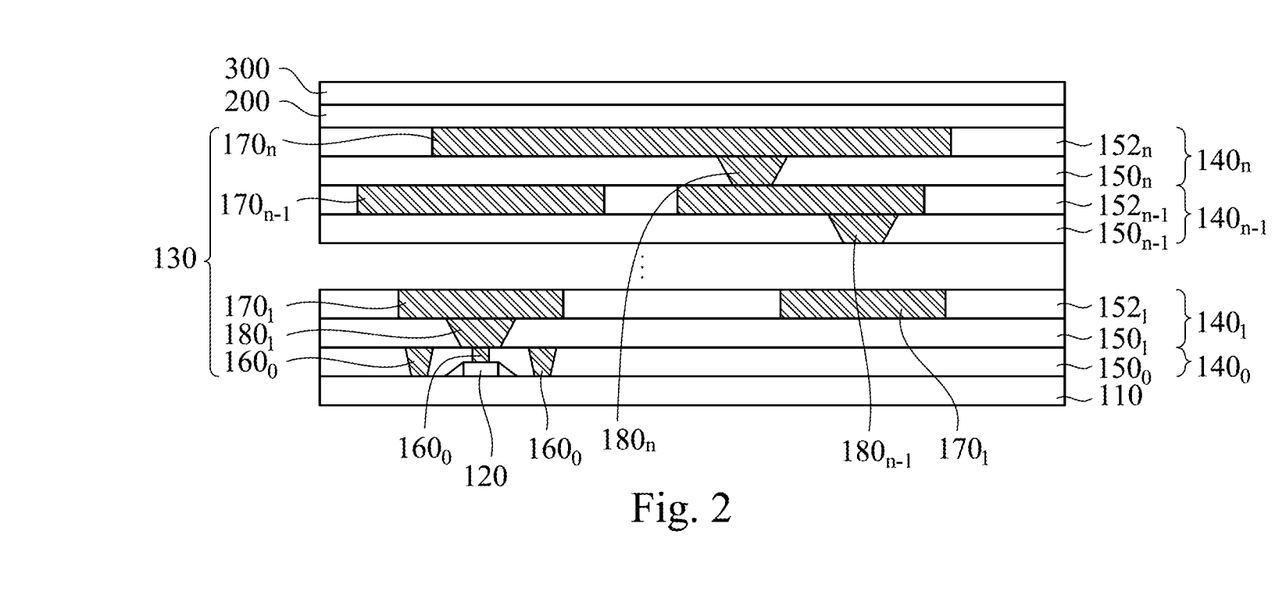

Referring to FIG. 2, the catalyst layer 300 is formed over the conductive layer 200. The catalyst layer 300 covers the conductive layer 200. In some embodiments, the catalyst layer 300 is a metal layer. For example, the catalyst layer 300 is an iron (Fe) film. The catalyst layer 300 may be formed by using e-beam evaporation or other suitable methods.

Figure 3:
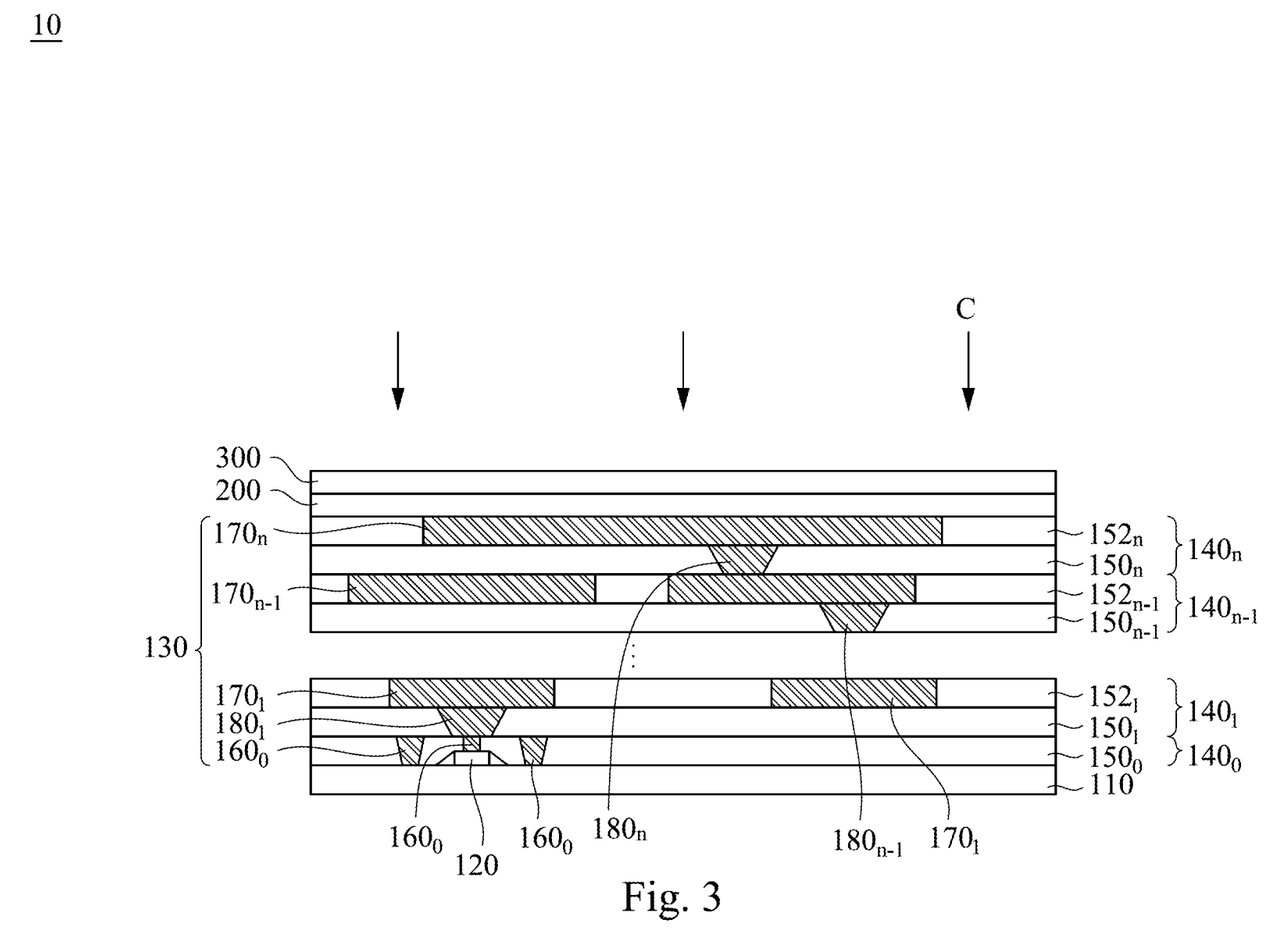
Figure 4:
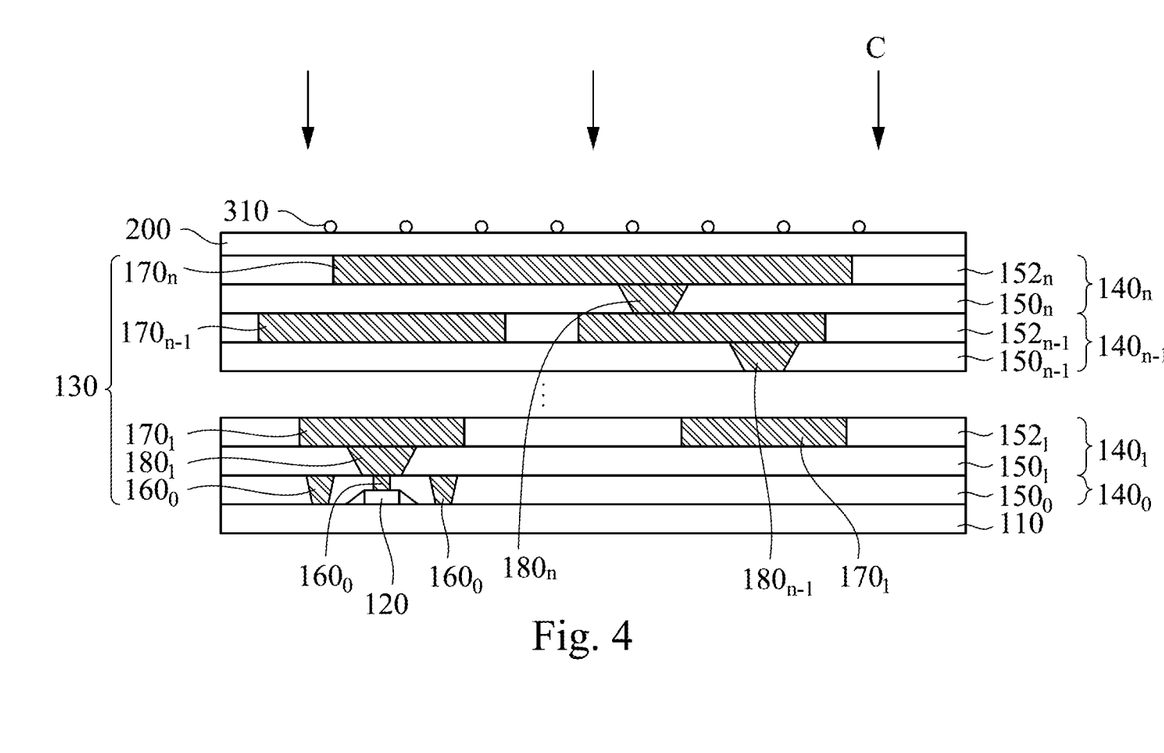
Figure 5:
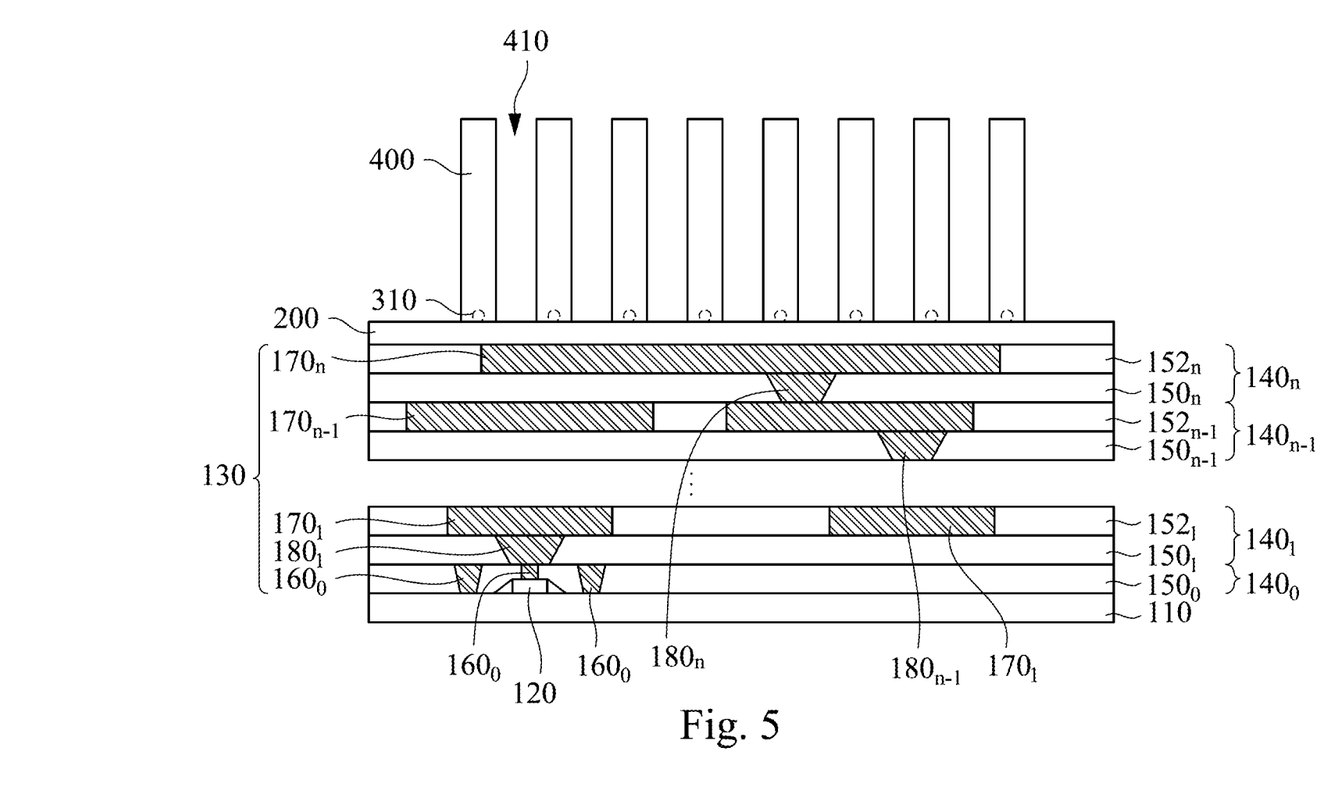

Referring to FIGS. 3 to 5, a surface treatment operation C is performed on the catalyst layer 300 prior to forming a plurality of carbon nanotubes 400. The surface treatment operation C may serves as a pre-processing operation of forming the carbon nanotubes 400, and the surface treatment operation C is beneficial for growing the carbon nanotubes 400. As shown in FIG. 3 and FIG. 4, the surface treatment operation C is performed so as to convert the catalyst layer 300 into the discontinuous catalyst particles 310. In greater details, the catalyst particles 310 are formed over the conductive layer 200 by using surface treatment operation C and beneficial for subsequent growing the carbon nanotubes 400. For example, the catalyst particles 310 are in contact with a surface of the conductive layer 200. The catalyst particles 310 may be metal particles, such as Fe particles. In some embodiments, the surface treatment operation C may include performing a hydrogen plasma treatment on a surface of the catalyst layer 300 such that the catalyst layer 300 converts into the catalyst particles 310. In some embodiments, the catalyst layer 300 is used to prevent the formation of metal silicide which would otherwise impede the formation of the carbon nanotubes 400. The catalyst layer 300 is also used to promote the transmission of electric charges between the carbon nanotubes 400 and the conductive layer 200.

As shown in FIG. 5, while the carbon nanotubes 400 are formed, the catalyst particles 310 may be wrapped in the carbon nanotubes 400. In the present embodiment, for convenience of explanation, a dashed line in FIG. 5 is used to illustrate the catalyst particles 310 are embedded in the carbon nanotubes 400 and also wrapped in the carbon nanotubes 400. For example, the structure of the carbon nanotubes 400 may be formed as carbon onions and the catalyst particles 310 are embedded therein.

In some embodiments, the carbon nanotubes 400 are vertically aligned carbon nanotubes bundles. A gap 410 is formed between the carbon nanotubes 400 and a portion of the conductive layer 200 is exposed. In other embodiments, the carbon nanotubes 400 may be formed as hollow tubes. The carbon nanotubes 400 include a via interconnect that is formed between the underlying conductive layer 200 and an overlying insulating layer 500 (see FIG. 8).

In some embodiment, the method of forming the carbon nanotubes 400 may use, for example, microwave plasma-enhanced chemical vapor deposition (MPECVD), or other suitable methods. In some embodiments, the carbon nanotubes 400 are formed using a carbon-containing precursor and a nitrogen-containing precursor. For example, the carbon-containing precursor may include, for example, $CH_4$, $C_2H_2$, $C_3H_6$, or other suitable gases, while the nitrogen-containing precursor may include, for example, $NH_3$, or other suitable gases.

Figure 6:
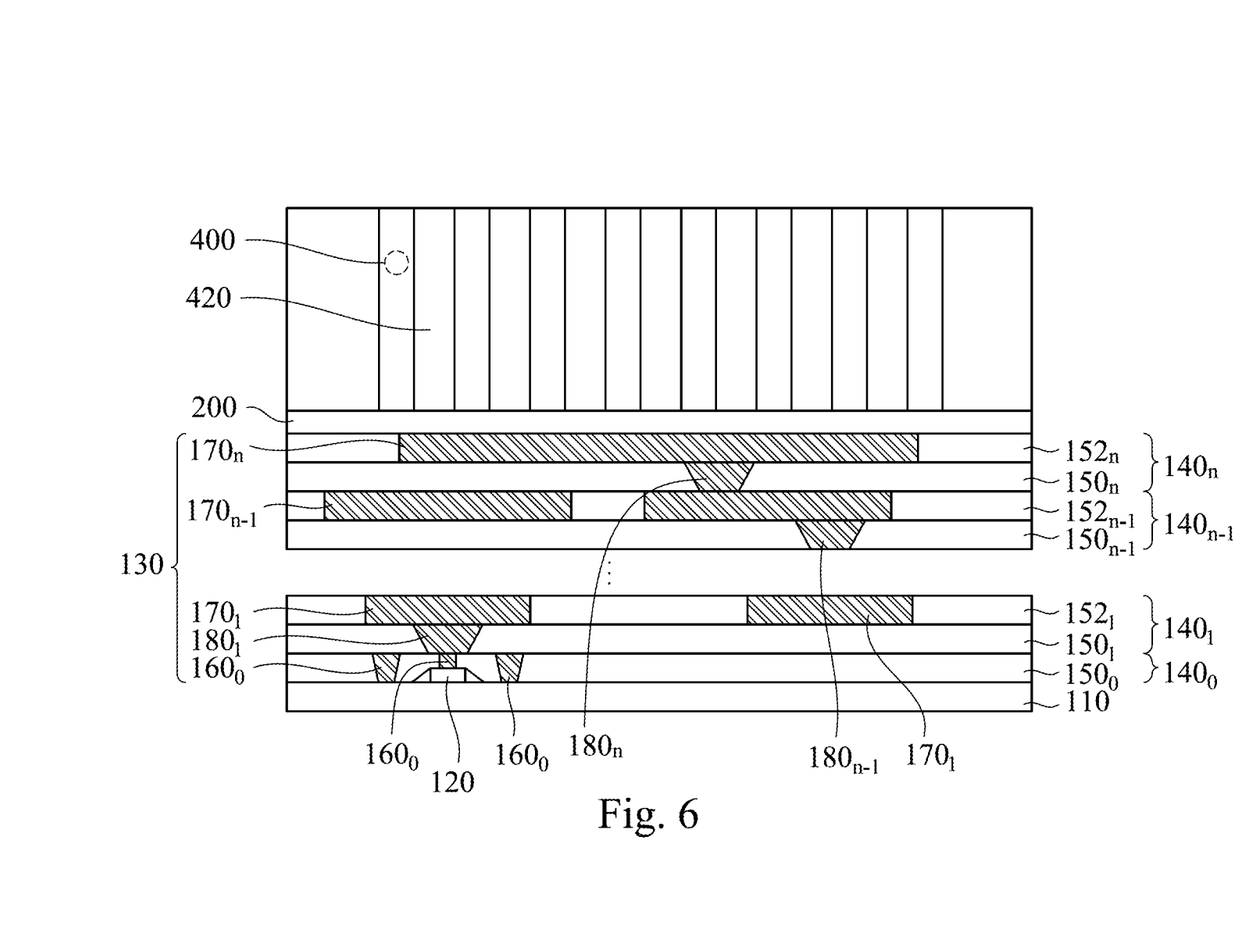

Referring to FIG. 6, a polymer 420 is filled in the gap 410 between the carbon nanotubes 400 after forming the carbon nanotubes 400. The carbon nanotubes 400 and the polymer 420 may serves as a first electrode of the memory device 10. In greater details, the polymer 420, e.g., the polydimethylsiloxane silicone solution, will slowly flow into the gap 410 between the carbon nanotubes 400. After the gap 410 is completely filled by the polymer 420, the polymer 420 is cured by heating up. The heating process will cure and harden the polymer 420 and turn it from a viscous liquid into an elastic solid. The curing time is highly dependent on the curing temperature, where curing is faster at a higher temperature. The appropriate curing time may also be different for different polymers. For example, while the polydimethylsiloxane silicone solution is used, the curing temperature is 100° C. and the curing time is 10 minutes.

Figure 7:
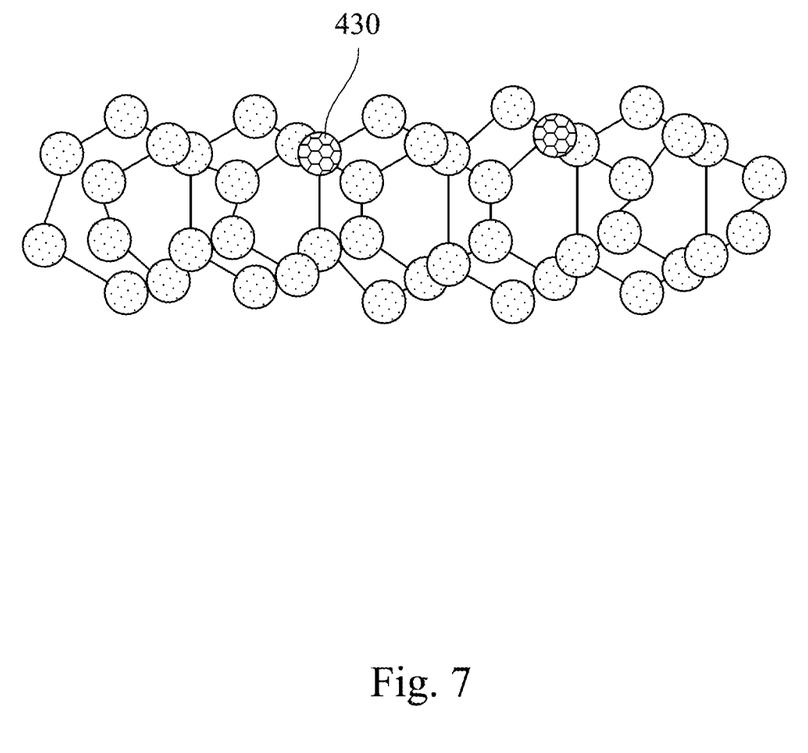
FIG. 7 is a partially enlarged view of FIG. 6 showing the structure of carbon nanotubes.

Referring to FIG. 7, FIG. 7 is a partially enlarged view of FIG. 6 showing the structure of the carbon nanotubes 400. As shown in FIG. 7, the carbon nanotubes 400 are nitrogen-doped (N-doped). In other words, at least one nitrogen atom 430 is doped in the carbon nanotubes 400. In some embodiments, the carbon-containing precursor and the nitrogen-containing precursor are utilized to form the nitrogen-doped carbon nanotubes 400. In greater details, a mixed gas including the carbon-containing precursor and the nitrogen-containing precursor are introduced with a temperature, e.g., 700° C., which leads to a high dissociation of the carbon-containing precursor and the nitrogen-containing precursor. As a result, the carbon-containing precursor and the nitrogen-containing precursor are decomposed and recombined and thus the nitrogen-doped carbon nanotubes 400 are manufactured.

The structure of nitrogen-doped carbon nanotubes 400 may have at least the following advantage. The rate of electric charges conduction between the nitrogen-doped carbon nanotubes 400 serving as the first electrode and the insulating layer 500 (see FIG. 8) can be improved and thus the conductivity of the first electrode can be improved. Furthermore, the adhesion of the nitrogen-doped carbon nanotubes 400 can be improved and thus will be beneficial for the adhesion between the first electrode and the insulating layer 500 (see FIG. 8).

In some embodiments, an atomic percentage of nitrogen in the nitrogen-doped carbon nanotubes 400 is in a range from about 2% to about 10%, so as to achieve better dispersion effect. If the atomic percentage of nitrogen in the nitrogen-doped carbon nanotubes 400 is greater than 10%, the nitrogen atoms may result in a cluster effect and not easy to disperse effectively. If the atomic percentage of nitrogen in the nitrogen-doped carbon nanotubes 400 is less than 2%, the nitrogen atoms may be not enough to achieve dispersion effect.

Figure 8:
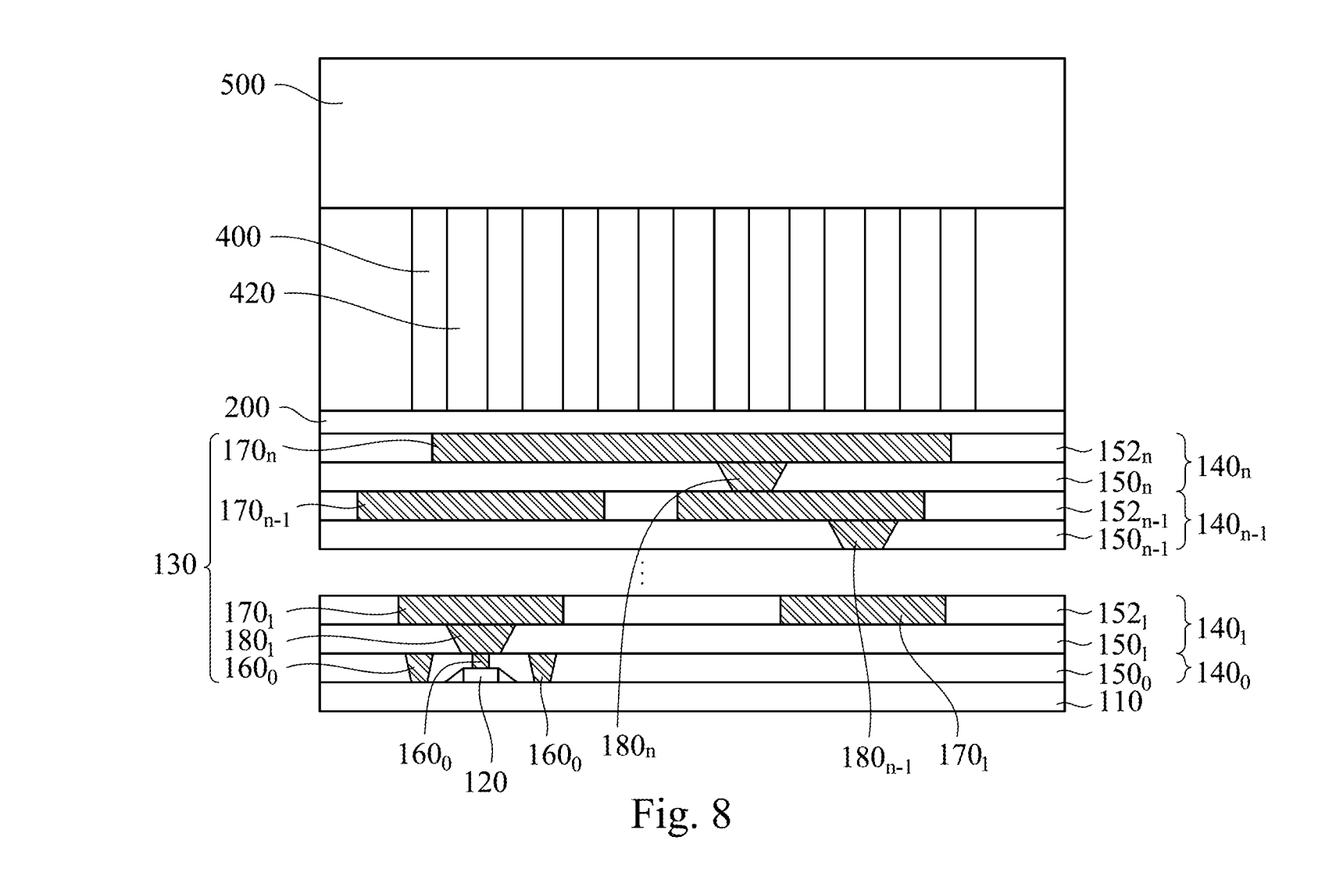
FIG. 8 and FIG. 9 are schematic views of a method of forming a memory device at various stages in accordance with an embodiment of the present disclosure.
Figure 9:
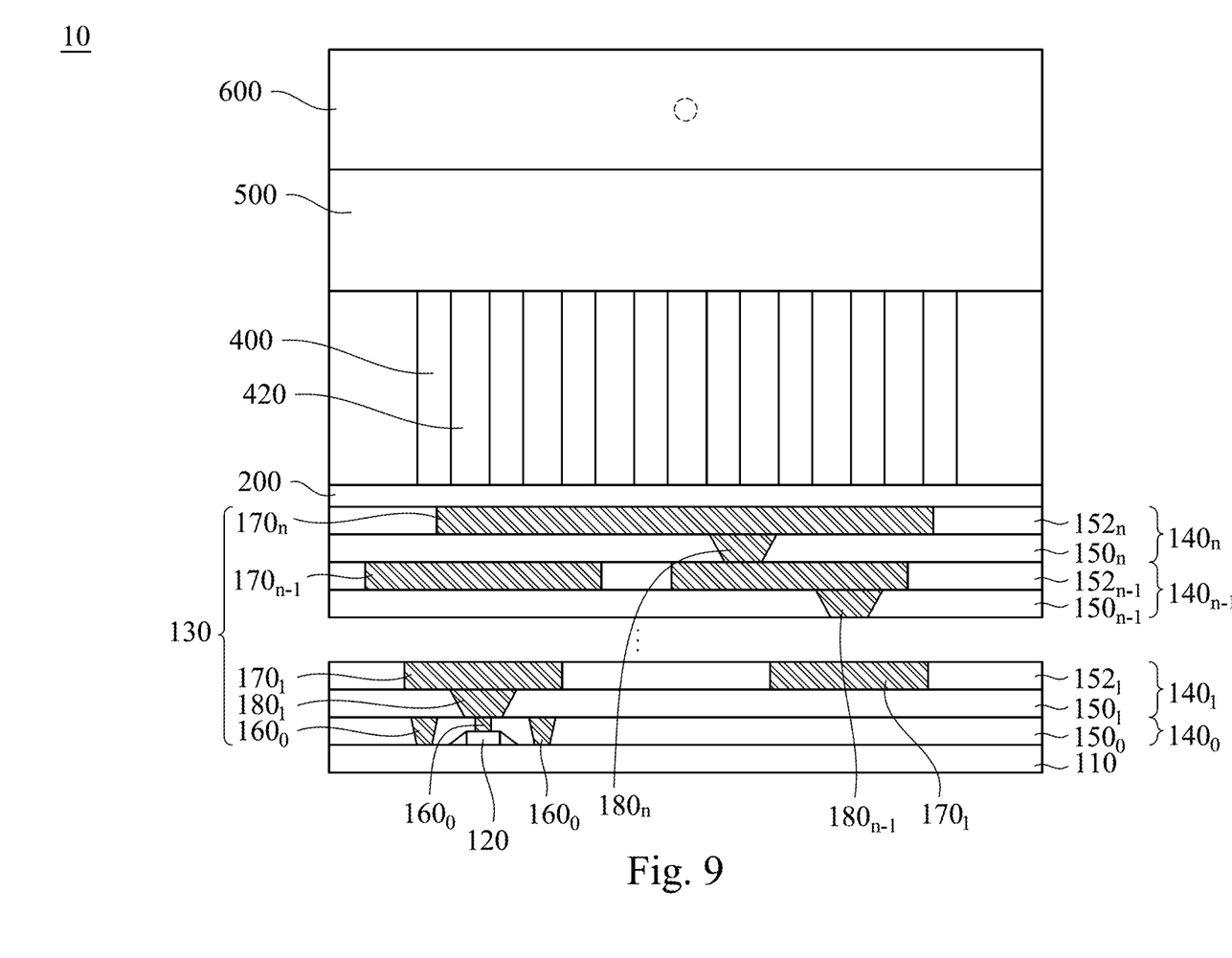

FIG. 8 and FIG. 9 are schematic views of a method of forming the memory device 10 at various stages in accordance with an embodiment of the present disclosure. Referring to FIG. 8, an insulating layer 500 is formed over the carbon nanotubes 400. In other words, the insulating layer 500 is blanket formed over the first electrode. Stated differently, the insulating layer 500 is in contact with the carbon nanotubes 400 and the polymer 420. In some embodiments, the insulating layer 500 may include $V_2O_5$, $Al_2O_3$, NiO, $TiO_2$, $SrTiO_3$, $ZrTiO_3$, or other suitable insulating materials. The method of forming the insulating layer 500 may use, for example, chemical vapor deposition (CVD), or other suitable methods.

Referring to FIG. 9, the graphene layer 600 is formed over the insulating layer 500 as a second electrode separated from the first electrode by the insulating layer 500. The method of forming the graphene layer 600 may use, for example, chemical vapor deposition (CVD), or other suitable methods. In some embodiments, the graphene layer 600 is formed using a carbon-containing precursor and a nitrogen-containing precursor. For example, the carbon-containing precursor may include, for example, $CH_4$, $C_2H_2$, $C_3H_6$, or other suitable gases, while the nitrogen-containing precursor may include, for example, $NH_3$, or other suitable gases.

In the present embodiments, the graphene layer 600 may serve as the top electrode, while the carbon nanotubes 400 and the polymer 420 may serve as the bottom electrode. In some embodiments, the graphene layer 600 may serve as the bottom electrode, while the carbon nanotubes 400 and the polymer 420 may serve as the top electrode, the disclosure are not limited thereto. Since the carbon-containing materials have a better conductivity to transmit the electric charges, the electrodes made of the carbon-containing materials can improve the rate of signal transmission. As a result, the memory device 10 with high speed can be achieved.

Figure 10:
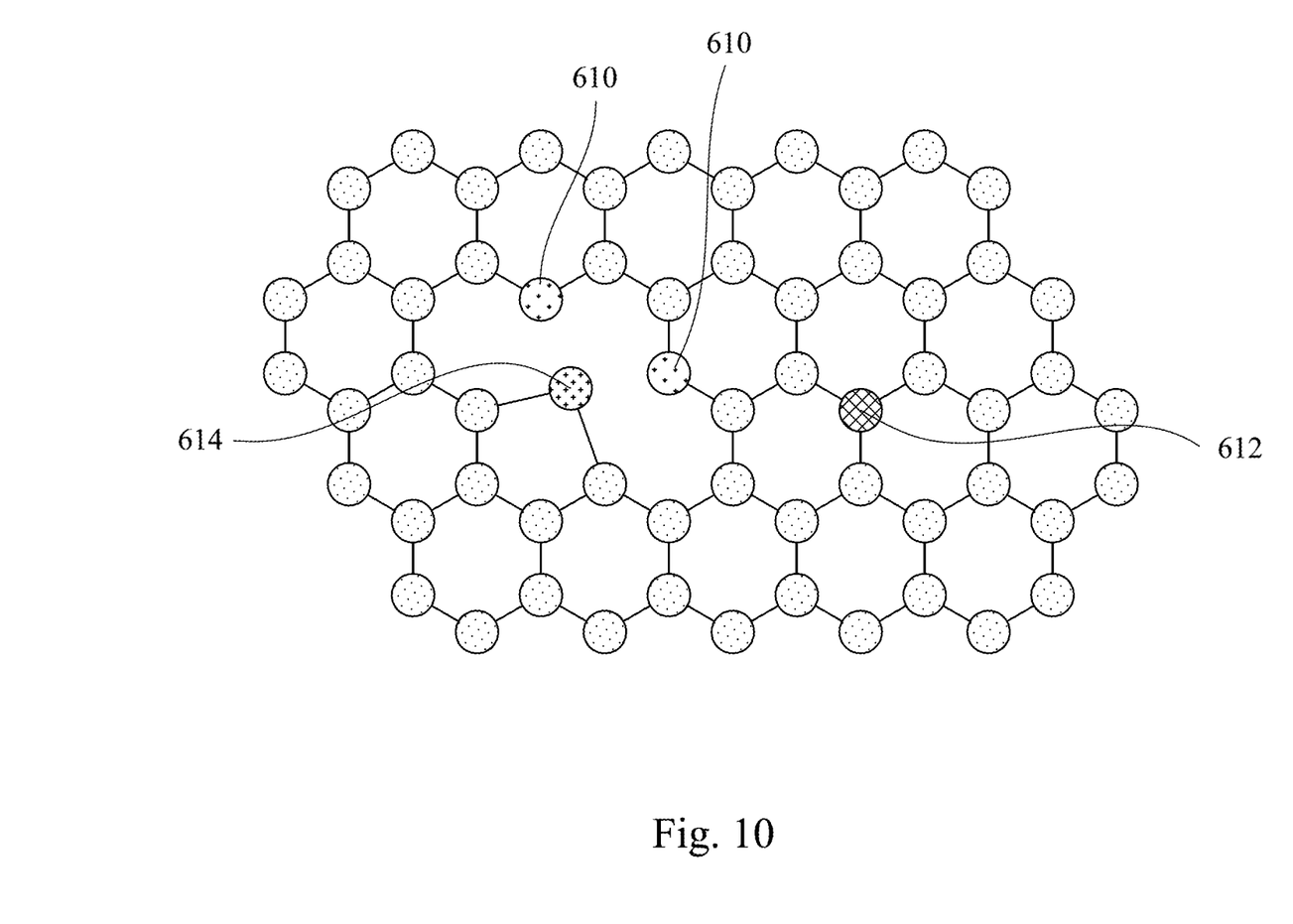
FIG. 10 is a partially enlarged view of FIG. 9 showing the structure of a graphene layer.

Referring to FIG. 10, FIG. 10 is a partially enlarged view of FIG. 9 showing the structure of the graphene layer 600. As shown in FIG. 10, the graphene layer 600 is nitrogen-doped. The nitrogen-doped graphene layer 600 may include at least one pyridinic nitrogen atom 610, graphitic nitrogen atom 612, and pyrrolic nitrogen atom 614. The pyridinic nitrogen atom 610 and pyrrolic nitrogen atom 614 are different in view of their bonding configurations with carbon atoms. In some embodiments, the carbon-containing precursor and the nitrogen-containing precursor are utilized to form the nitrogen-doped graphene layer 600. In greater details, a mixed gas including the carbon-containing precursor and the nitrogen-containing precursor are introduced with a temperature, e.g., 700° C., which leads to a high dissociation of the carbon-containing precursor and the nitrogen-containing precursor. As a result, the carbon-containing precursor and the nitrogen-containing precursor are decomposed and recombined and thus the nitrogen-doped graphene layer 600 is manufactured. For example, the nitrogen-doped graphene layer 600 may be a graphene sheet.

The structure of nitrogen-doped graphene layer 600 may have at least the following advantage. The rate of electric charges conduction between the nitrogen-doped graphene layer 600 serving as the second electrode and the insulating layer 500 can be improved and thus the conductivity of the second electrode can be improved. Furthermore, the adhesion of the nitrogen-doped graphene layer 600 can be improved and thus will be beneficial for the adhesion between the second electrode and the insulating layer 500.

In some embodiments, an atomic percentage of nitrogen in the nitrogen-doped graphene layer 600 is in a range from about 2% to about 10%, so as to achieve better dispersion effect. If the atomic percentage of nitrogen in the nitrogen-doped graphene layer 600 is greater than 10%, the nitrogen atoms may result in a cluster effect and not easy to disperse effectively. If the atomic percentage of nitrogen in the nitrogen-doped graphene layer 600 is less than 2%, the nitrogen atoms may be not enough to achieve dispersion effect.

Figure 11:
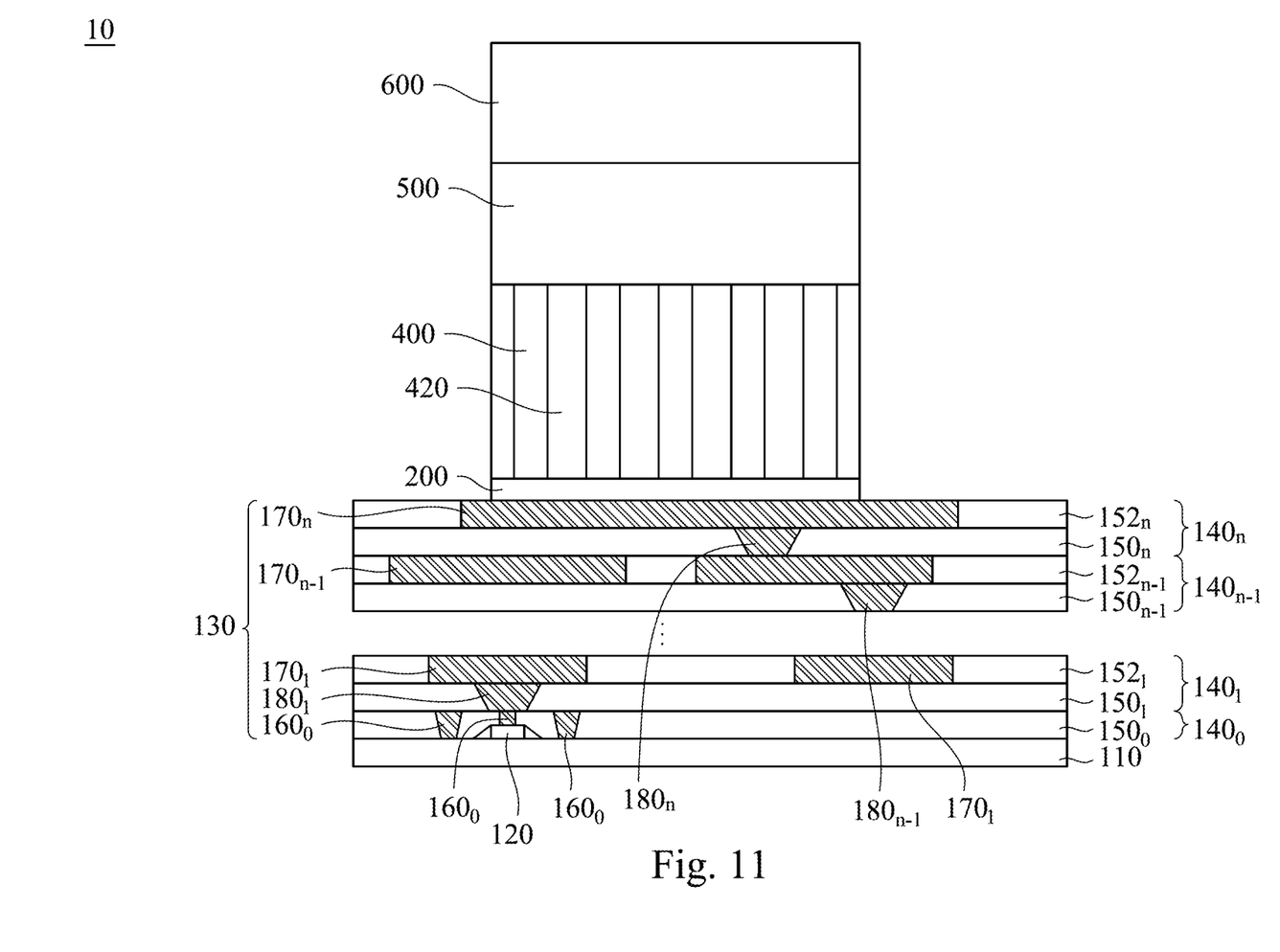
FIG. 11 and FIG. 12 are schematic views of a method of forming a memory device at various stages in accordance with an embodiment of the present disclosure.
Figure 12:
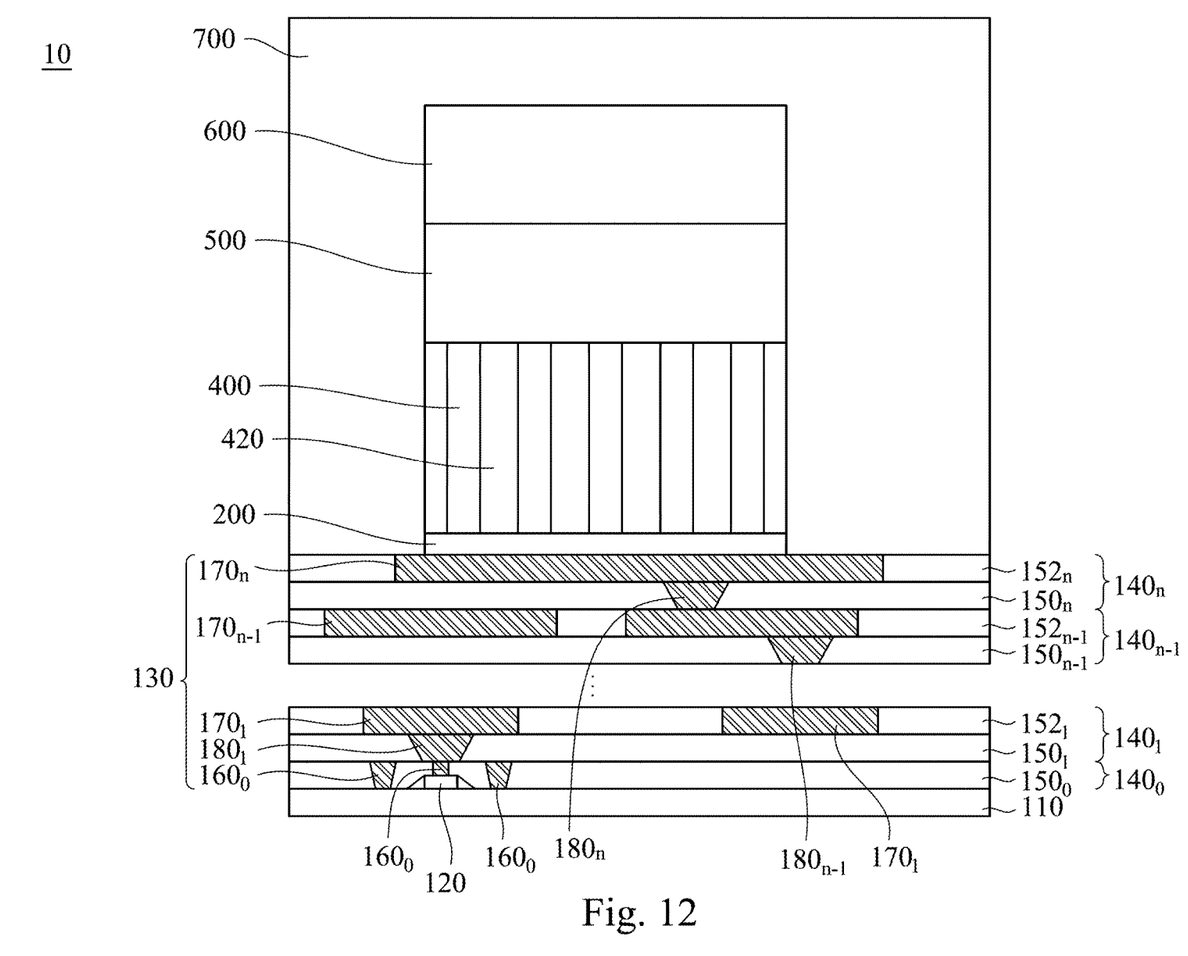

FIG. 11 and FIG. 12 are schematic views of a method of forming the memory device 10 at various stages in accordance with an embodiment of the present disclosure. As shown in FIG. 11, a portion of the memory device 10 is etched. In greater details, a portion of the graphene layer 600, the insulating layer 500, the carbon nanotubes 400, the polymer 420, and the conductive layer 200 are patterned using suitable etching techniques.

Referring to FIG. 12, a dielectric layer 700 is formed over the substrate 110. In other words, the dielectric layer 700 covers the graphene layer 600. Stated differently, the dielectric layer 700 surrounds the graphene layer 600, the insulating layer 500, the carbon nanotubes 400, the polymer 420, and the conductive layer 200. In some embodiments, the dielectric layer 700 may be referred to as an inter-metal dielectric (IMD) layer. The dielectric layer 700 may include, for example, silicon oxide, low-k silicon oxide such as a porous silicon oxide layer, other suitable dielectric material, or the combinations thereof.

Although the present disclosure has been described in considerable detail with reference to certain embodiments thereof, other embodiments are possible. Therefore, the spirit and scope of the appended claims should not be limited to the description of the embodiments contained herein.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a conductive layer;
a bottom electrode comprising a plurality of carbon nanotubes and over the conductive layer;
an insulating layer over the carbon nanotubes, wherein the insulating layer has a first portion and a second portion in direct contact with the first portion, wherein the conductive layer, the bottom electrode and the insulating layer are arranged along a vertical direction, and wherein the carbon nanotubes extend from a top surface of the conductive layer to a bottom surface of the insulating layer along the vertical direction; and
a top electrode comprising a graphene layer separated from the carbon nanotubes by the insulating layer, wherein the first portion of the insulating layer is in direct contact with the graphene layer and the second portion of the insulating layer is in direct contact with the carbon nanotubes.

2. The memory device of claim 1, wherein the carbon nanotubes are nitrogen-doped.

3. The memory device of claim 1, wherein the graphene layer is nitrogen-doped.

4. The memory device of claim 1, wherein the graphene layer fully covers the carbon nanotubes.

5. The memory device of claim 1, wherein the insulating layer comprises $V_2O_5$, $Al_2O_3$, NiO, $TiO_2$, $SrTiO_3$, or $ZrTiO_3$.

* * * * *